United States Patent [19]
Gompert

[11] 3,934,196
[45] Jan. 20, 1976

[54] SERVOED INDICATING APPARATUS
[75] Inventor: Leon T. Gompert, Cedar Rapids, Iowa
[73] Assignee: Rockwell International Corporation, El Segundo, Calif.
[22] Filed: Nov. 15, 1973
[21] Appl. No.: 415,876

[52] U.S. Cl. ............. 324/99 R; 318/636; 324/151 A
[51] Int. Cl.² .................... G01R 17/06; G01R 1/16
[58] Field of Search...... 324/99 R, 100, 151, 151 A; 318/636, 638

[56] References Cited
UNITED STATES PATENTS
3,430,141  2/1969  Gilchrist............................ 324/99 R

*Primary Examiner*—R. V. Rolinec
*Assistant Examiner*—Ernest F. Karlsen
*Attorney, Agent, or Firm*—Bruce C. Lutz; Terry M. Blackwood; Robert J. Crawford

[57] ABSTRACT

A torque motor incorporating a permanent magnet rotor and winding therewith for providing the indicating mechanism of a servoed indicating unit. The circuitry for use with the indicating mechanism first applies a reference feedback-producing pulse, then provides the signal for application of torque to the indicator to move it toward the desired position, and then has a quiescent period to clear the stator windings of the mechanism of currents before recommencing the voltage reference and torquing cycle.

4 Claims, 8 Drawing Figures

SERVOED INDICATING APPARATUS

THE INVENTION

The present invention is generally concerned with electrical apparatus and more specifically with a servoed type mechanism for providing indications of input signals.

Many attempts have been made in the prior art to produce servoed pointer units. However, in all known instances these units have used the D'Arsonval-type meter movements or other similar type prime moving arrangement. An example of such a system is shown in a U.S. Pat. No. 3,577,195. These prior art devices have been found lacking by the present inventor in terms of costs and/or the reliability of the overall mechanism and in particular the feedback mechanism under various temperature extremes.

The present invention utilizes a relatively standard torque motor design incorporating a permanent magnetic rotor having a feedback winding attached to the rotor in one embodiment. The torque motor is used in a limited rotation application and thus the output from the feedback windings may either utilize slip rings or flexible leads where the leads may be of the standard variety or the hair spring terminal type as examples.

While the preferred embodiment has the feedback winding on the rotor, especially when rate indication is not required, the reference input winding may alternately be that on the rotor with the feedback winding and/or a rate feedback winding being the stator. In either instance, the operation is very similar.

It is, therefore, an object of the present invention to provide improved servoed indicating apparatus.

Other objects and advantages of the present invention may be ascertained from a reading of the specification and appended claims in conjunction with the drawings wherein:

DETAILED DESCRIPTION

Figure 1:
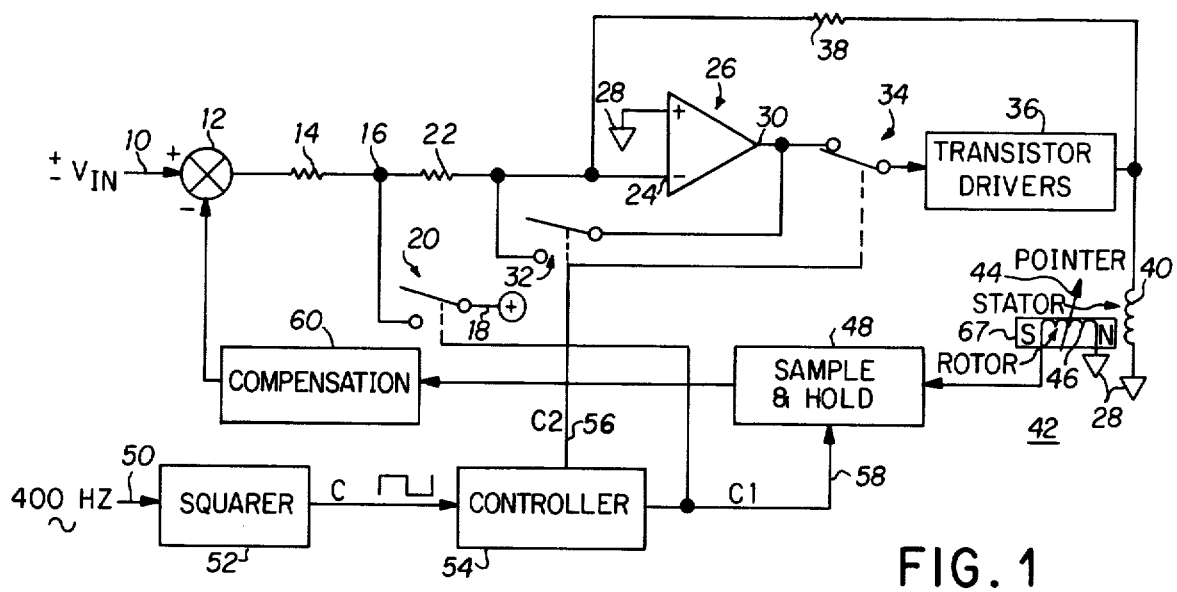
FIG. 1 is a block diagram of a preferred embodiment of the invention having the control winding on the stator.

In FIG. 1 an input terminal 10 supplies a first input to a summing means or comparator 12 which has an output applied through resistor 14 to junction point 16. A positive reference potential 18 is connected through a single pole single throw switch generally designated as 20 to the junction point 16. As shown, the switch 20 is open. Junction point 16 is connected through resistor 22 to an inverting input 24 of an amplifier generally designated 26 and having a non-inverting input thereof connected to ground 28. An output 30 of amplifier 26 is connected through normally open single pole single throw switch 32 back to inverting input 24. Output 30 is also connected through a normally closed single pole single throw switch 34 to a transistor driver circuit 36. An output of transistor driver circuit 36 is connected in a feedback fashion through resistor 38 to input 24 of amplifier 26. The output of driver 36 is also connected to one end of a stator winding 40 on a stator of torque motor mechanism or indicator means generally indicated as 42. A pointer 44 is coupled or otherwise physically attached to a permanent magnet rotor upon which a rotor winding 46 is coupled. One end of each of the stator and rotor windings 40 and 46, respectively, are connected to ground 28. The other end of rotor winding 46 is connected to an input of a sample and hold circuit 48. A second input 50 providing a 400-Hz sine wave is applied to squaring circuit 52 and produces an output waveform C as illustrated. This is further illustrated in FIG. 2 in comparison with other signals C1 and C2. Waveform C is applied to controller circuit 54 which has output leads 56 and 58. Lead 56 is applied to control switches 32 and 34 while lead 58 is applied to a second input of sample and hold circuit 48 as well as being used to control the operation of switch 20. An output of sample and hold circuit 48 is applied to compensation circuit 60 which provides a lead effect to feedback signals. An output of compensation circuit 60 is applied to a second input of summer 12.

It should be noted here that the stator winding may in actuality be only one winding, which is time shared for the functions of control and either reference input or pickoff information as shown, or two separate windings. The rotor winding, on the other hand, will normally be a single winding having the function of either reference input or pickoff information as a complement to that of the stator winding.

Figure 2:
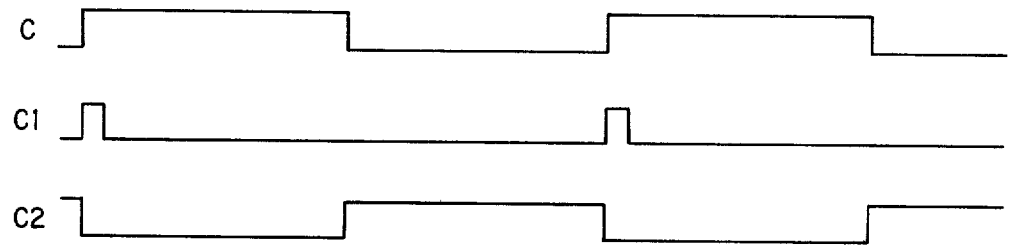
FIG. 2 is a waveform presentation of signals within FIG. 1.

As indicated above, the three waveforms in FIG. 2 are shown as representing the waveforms to be found in various portions of FIG. 1. Further comment is believed unnecessary except to state that the waveform C2 appears on lead 56 and in the positive condition actuates the switches 32 and 34 from the position shown to the opposite position. The waveform C1 which is found on lead 58 in the positive condition changes switch 20 to a condition opposite to that shown.

Figure 3:
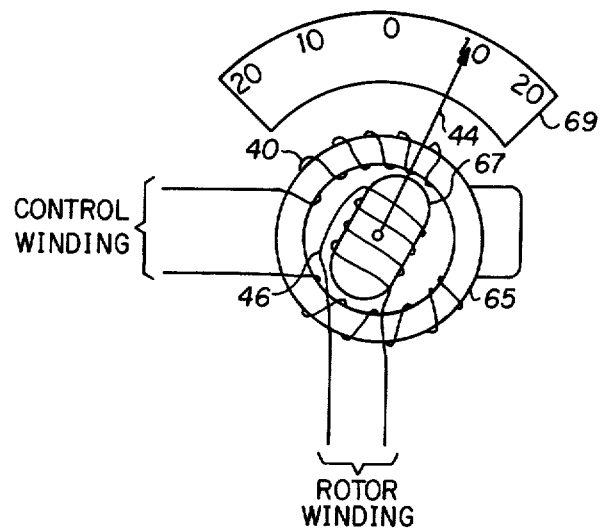
FIG. 3 is a symbolic drawing of a torque motor designed in accordance with the present inventive concept.

FIG. 3 illustrates the torquing motor or servoed indicator device generally indicated as 42 in FIG. 1 and indicates the stator windings 40 as well as the rotor winding 46. The stator itself in FIG. 3 is labeled as 65 while the rotor is labeled 67. The pointer 44 is shown indicating approximately 10 on a scale designated as 69. The control torque winding is that connected in FIG. 1, respectively, to the transistor driver 36 and ground 28. The pickoff winding is that connected to ground 28 and to the input of sample and hold circuit 48. As illustrated these leads are flexible and within predetermined design limits will provide adequate flexibility to allow operation of the indicating unit. While maximum operational limitations are not presently known, it appears that the device will work satisfactorily within ±50° of the null point (that point wherein the north and south poles of the permanent magnet rotor are at right angles to the electrical north and south poles of the stator control windings).

Figure 4:
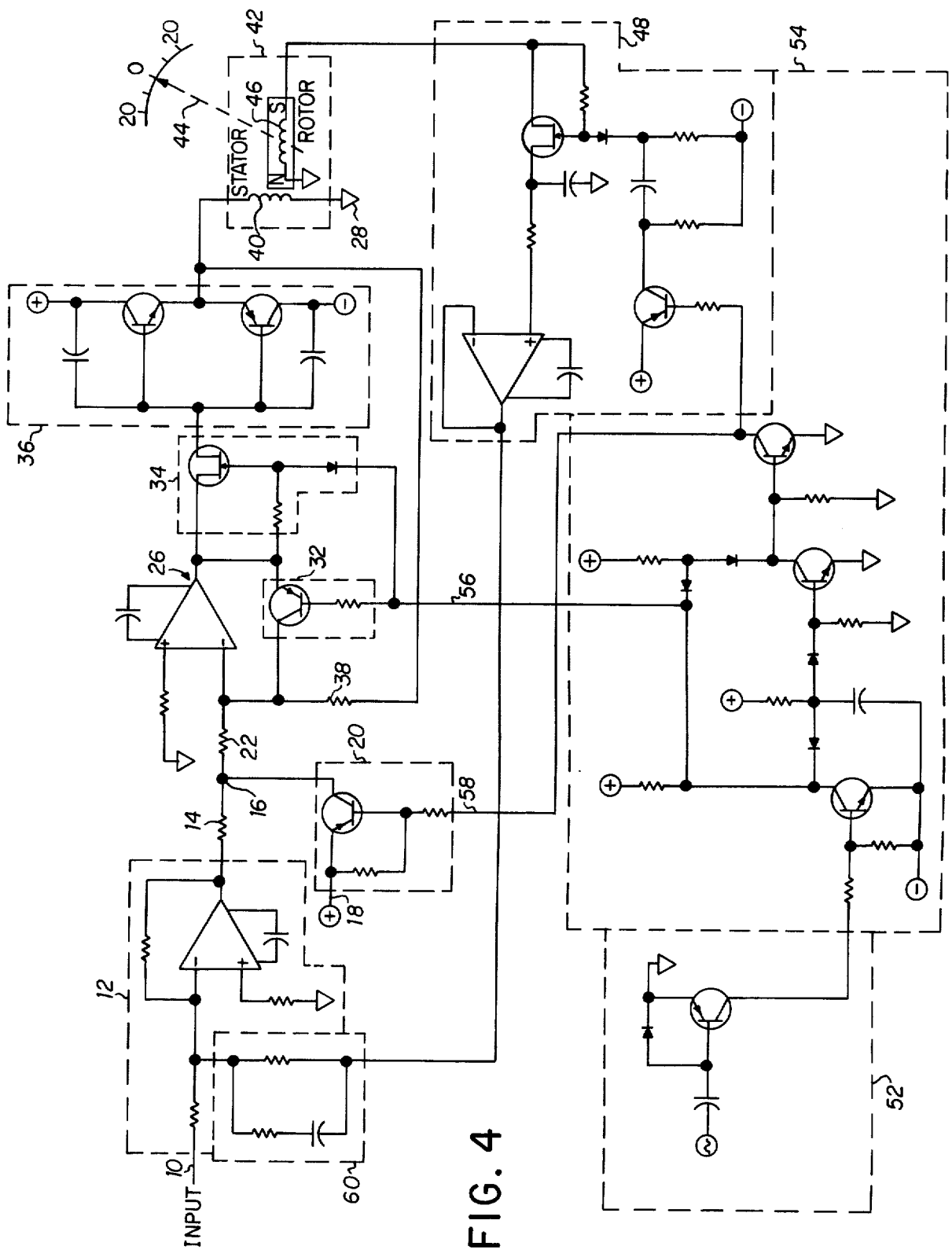
FIG. 4 is a detailed schematic diagram of the circuit for controlling the torque motor indicator presented in FIG. 1.

In view of the application of designating numbers in FIG. 4 which are the same as those illustrated in FIG. 1, it is believed that very little explanation is required in FIG. 4. However, it will be noted that the various switches 20, 32, and 34 are transistors. The amplifiers such as 26 and those within blocks 12 and 48 are standard operational differential input amplifiers and the remaining components are obvious to one skilled in the art.

Figure 5:
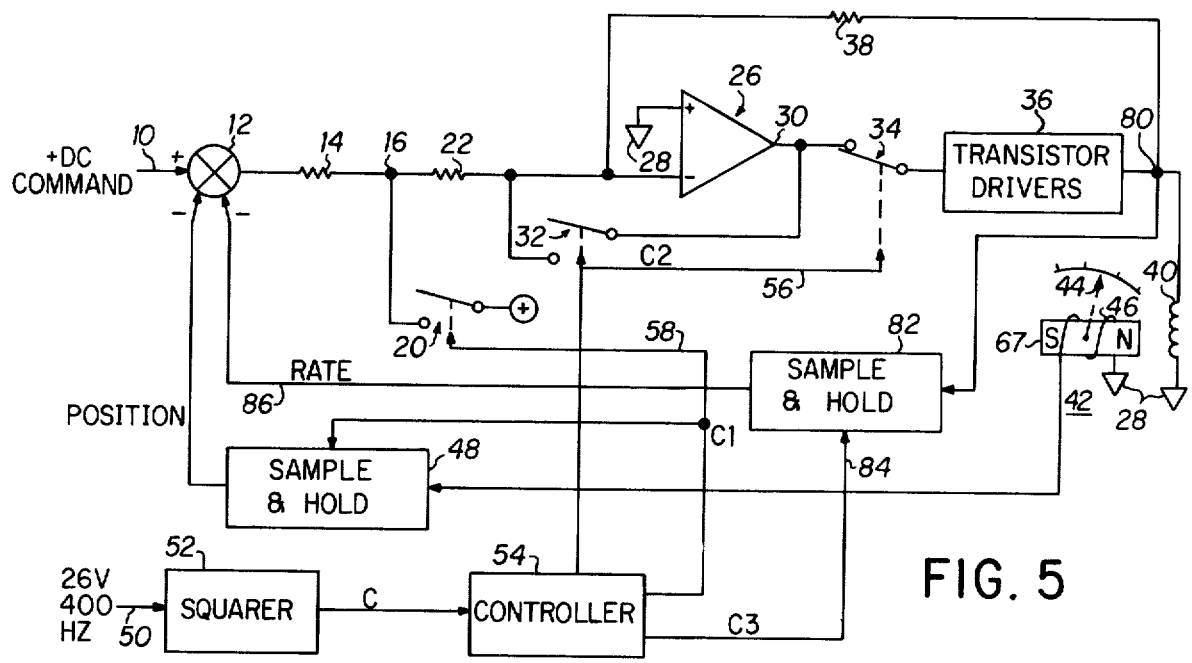
FIG. 5 is a block diagram of the preferred embodiment of the invention utilizing rate control in addition to the feedback of FIG. 1.

As previously stated, FIG. 5 is substantially the same as FIG. 1 with the added circuitry of a sample and hold 82 to provide a rate signal. FIG. 5 does not contain the compensation circuit 60 because the rate circuit is utilized to perform the same function. In FIG. 5 a junction point at the output of driver 36 is labeled 80. This output supplies one lead of resistor 38 and one end of winding 40. It further is applied to a first input of sample and hold circuit 82 having a second input on a line 84 which is further labeled as C3. An output of sample and hold circuit 82 is labeled 86 and is further labeled as rate and is applied as a further input to summing means 12. As will be noted, the summing means 12 has negative inputs of rate and position while it has a positive input of a DC command signal in the embodiment as shown.

Figure 6:
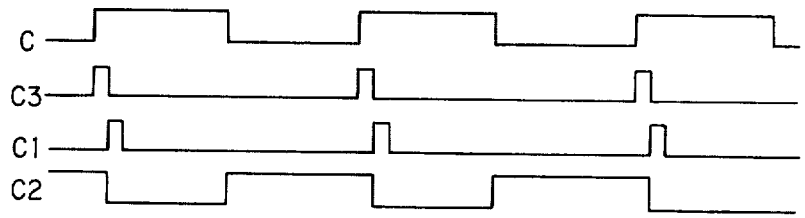
FIG. 6 is a set of waveforms representing signals in FIGS. 5 and 7.
Figure 7:
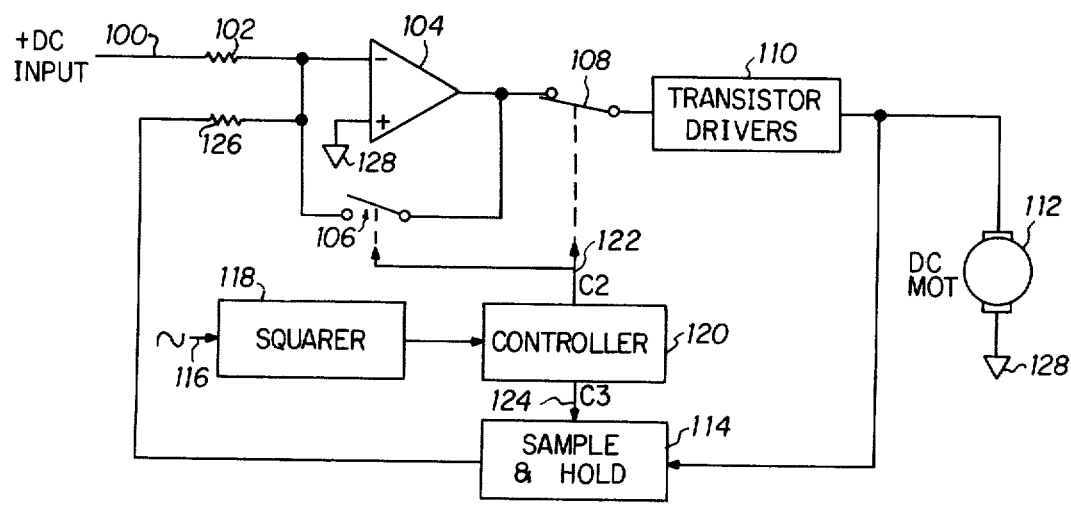
FIG. 7 is a block diagram of the inventive concept in an embodiment for controlling the speed of a DC motor.

In FIG. 6 various waveforms are illustrated with labels corresponding to the places within the circuits of FIGS. 5 and 7 wherein these waveforms may be found.

In FIG. 7 a DC input 100 is supplied through a resistor 102 to a negative input of a differential amplifier 104 having an output which is returned through a switch 106 to the input of the amplifier 104 and is also supplied through a switch 108 to an input of a transistor driver 110. An output of transistor driver 110 is supplied to a DC motor 112 and also to an input of a sample and hold circuit 114. An alternating signal 116 is supplied to a square circuit 118 whose output is applied to a controller circuit 120. The controller 120 has an output on a lead 122 for controlling switches 106 and 108 in the fashion shown of waveform C2 in FIG. 6. An output on lead 124 is the same as that designated as C3 in FIG. 6. An output of sample and hold circuit 114 is supplied through a resistor 126 and also supplied to the negative input of amplifier 104. The positive input of this amplifier is connected to ground 128.

Figure 8:
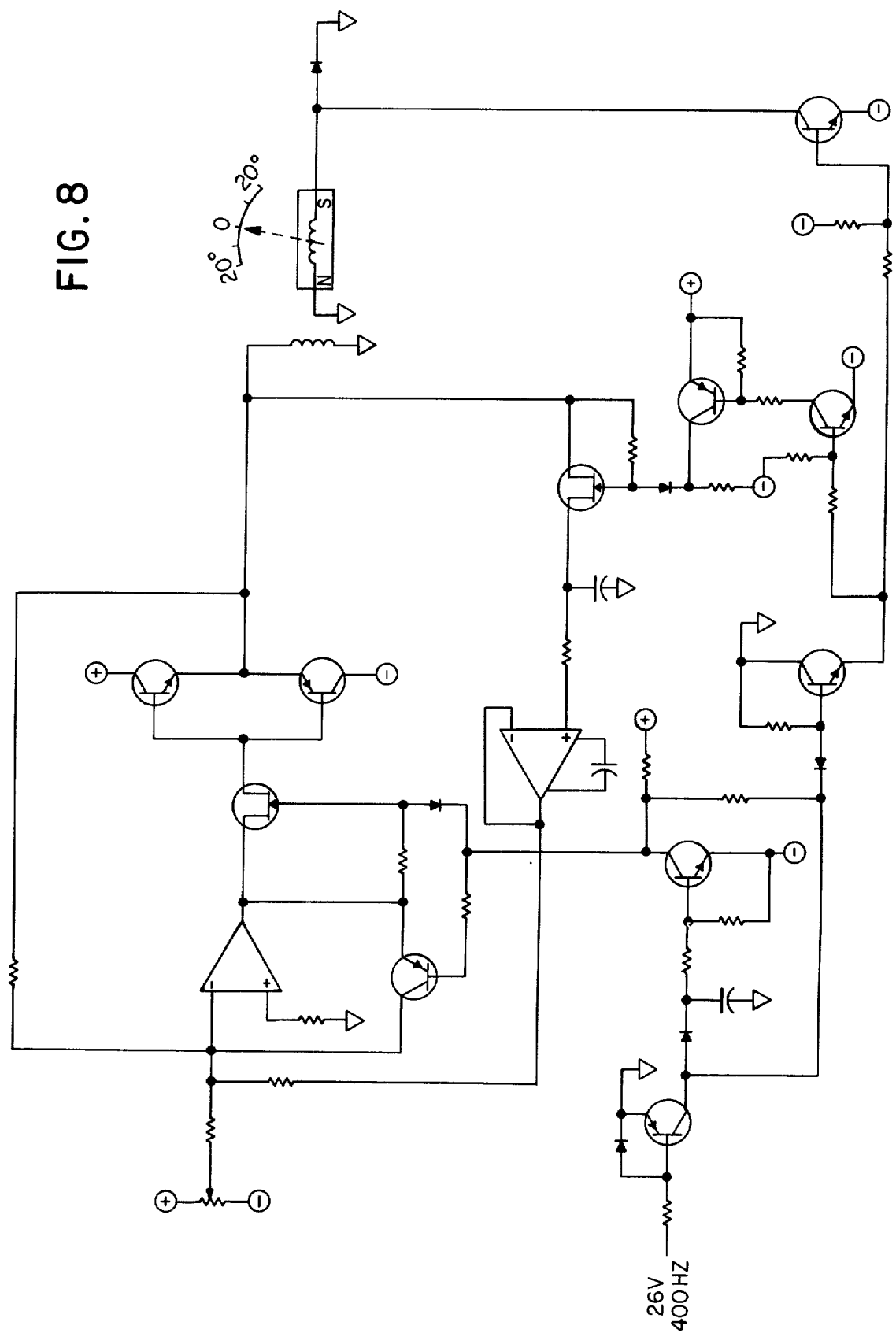
FIG. 8 is a detailed schematic diagram of the circuit of FIG. 5.

In reviewing FIG. 8 and comparing this circuit with FIG. 4, it will be realized that the two circuits are fairly comparable. The distinction lies in that the reference input signal is supplied to the rotor and the pickoff signal is taken off the stator as mentioned supra. Thus, FIG. 8 in combination with FIG. 4 illustrates that the preferred embodiment of FIG. 1 may be modified with the rotor winding having the function of either a reference signal input or a pickoff, and the stator winding having the function of being a control signal winding and in addition being either a reference signal input or pickoff winding depending upon the function of the complementary rotor winding.

OPERATION

Referring first to FIG. 3, it will be noted that the motor device, prime mover or servoed indicator device 42 utilizes a permanent magnetic rotor 67 having a single winding 46 thereon. Flux generated in the torque control winding 40 produces a north and south pole on the quadrature axis of the rotor poles of the permanent magnet 67 when the indicator is pointing to zero and thus creates torque on the rotor. It may also be noted that if a reference voltage is applied to this same control torque winding 40, flux generated thereby passes through the rotor at right angles to the axis of the rotor winding when at null. Thus, there is no electrical output from the rotor winding 46 when the rotor 67 is at the null indication. When the rotor 67 is moved from the null indication condition, reference flux obtained from control torque winding 40 begins to couple into loops of rotor winding 46 thereby generating an output voltage proportional to deviation of rotor 67 from the null condition and of a phase dependent upon the direction of movement from the null condition. The phase will be substantially opposite or 180° different in one direction of rotation from null as compared to the other direction. If a short duration reference voltage pulse is applied to the control torque winding 40, the output from rotor winding 46 will also be a short pulse. The polarity of the output pulse from the rotor winding will indicate direction of deviations from null and the number of degrees of rotation from the null point will determine the magnitude of the pulse appearing at the output of the pickoff winding 46.

Referring now to FIG. 1 and FIG. 2, it will be noted that a signal appearing on lead 50 is utilized to produce the various waveforms of FIG. 2. These waveforms provide for operation of torque motor 42 for one-half of each input cycle whereby the device may remain in a quiescent condition for the other half-cycle. While it was convenient to utilize full-half cycles of operation and quiescent conditions, the active and quiescent conditions need not be identical but can be altered in relative duration. Thus, the quiescent condition could be shortened considerably as compared to the active or rotor moving time period.

In normal operation, beginning with a rising voltage on waveform C, it will be determined that initially a pulse C1 is applied. This pulse C1 activates switch 20 as well as sample and hold circuit 48. The activation of switch 20 applies a reference voltage at 16. Although as will be explained later, there is an error voltage being applied to resistor 14 from summer 12 simultaneous with the reference voltage, this error voltage is overridden by the reference voltage. This error voltage at 16 is amplified by amplifier 26 and driver 36 and produces flux in the stator winding 40. Thus, flux is coupled into rotor winding 46 whereby an output voltage is produced and sampled by sample and hold circuit 48. As mentioned supra, this output voltage is of a polarity depending upon direction of rotation of the rotor 67 from the null condition and of a magnitude depending upon the amount of rotation. This signal is sampled and held by sample and hold circuit 48 and applied through the compensation circuit 60 to be compared with the input voltage. If the input on lead 10 is exactly the same as that fed back, after the pulse C1 is dissipated and switch 20 returns to its illustrated normal condition, there will be no signal to be amplified by amplifier 26 and driver 36 and thus no control voltage will be applied to stator winding 40. However, if the input does not equal the feedback, the error signal will drive the amplifiers thus producing a current in stator 40 which will generate torque to rotate the permanent magnet rotor 67 in such a direction as to minimize the error. As will be realized, the single polarity reference pulse will cause a slight amount of servo error to cancel the slight torquing effect of the single polarity reference pulse. That is, the single polarity reference pulse in stator winding 40 tends to create another torque component on permanent magnet rotor 67, and in order to achieve an overall zero torque effect on the rotor, the servo loop feedback signal must change appropriately which in turn means the rotor position (i.e., the indicator position) has to be slightly different from the one desired. This servo error is small and relatively constant, since the time duration of the pulse is of constant magnitude and relatively short compared to the remaining torquing cycle, permitting the pointer error to be calibrated out. This error could be eliminated if desired by applying an equivalent pulse of opposite polarity in a like manner to the torquer.

The compensation circuit 60 provides a lead effect to high frequency signals such that the error signal is higher immediately after the cessation of the C1 signal than it is at the end of each C positive pulse. This provides what is referred to in the art as lead compensation and is very similar to rate feedback. The present inventive embodiment did not require rate feedback since capacitive compensation is cheaper to implement.

At the beginning of the time period when pulse C2 is positive, the switches 32 and 34 are changed from their normal condition whereby the amplifier 26 is driven to an 0 output condition and the input to driver 36 is open. By opening the drive lead to stator winding 40, the winding is allowed to dissipate its energy quickly before the next C1 reference pulse is applied. If this dissipation of energy in winding 40 is not provided, a true indication of the position of rotor 67 is not obtained from winding 46 when the reference pulse is applied. This is due to the flux changes generated by the current already in the winding 40. Thus, it is necessary in the embodiment illustrated to place the stator winding 40 in a quiescent condition for a predetermined time period before applying the reference input from 18.

As previously indicated, the compensation circuit 60 of FIG. 1 provides an initial high rate of change upon a sudden change in input and reduces this rate of change through the use of capacitive circuitry as the pointer approaches the desired indication. If so desired, the rate indication can be taken from the back EMF generated by the stator winding. This possibility is illustrated in FIG. 5. As shown, the square wave C of FIG. 6 produces the various outputs C1–C3. While C2 is in a logic 1 condition, it operates switches 32 and 34 thus disabling the amplifier 26. After the stator current in winding 40 has decayed to zero, any residual voltage at junction point 80 in FIG. 5 will be due to back EMF. This back EMF is of course proportional to rate. The back EMF is generated by the magnetic field of the permanent magnetic rotor 67 cutting through the wires of stator winding 40. As will be noted, C3 actuates the sample and hold 82 to sample this back EMF after the decay of the stator current. When C3 drops to zero, thereby deactivating the input to the sample and hold circuit 82, the pulse C1 is activated and C2 is deactivated. At this time, the sample and hold circuit 48 establishes an indication of the position of the rotor 67 and thus of the pointer 44 for feeding back information to the summing circuit 12.

The operation of FIG. 7 is fairly obvious in view of the descriptions of operations given above. As will be noted, the switches 106 and 108 will be activated to positions opposite those shown when waveform C2 is at a logic 1 value. The waveform C2 is the same as shown in FIG. 6. During this time the stator currents in the motor 112 will be allowed to decay. At the very end of this time a sample is taken of the back EMF generated by the rotating portion of the DC motor and the rate voltage indication obtained is supplied to resistor 126 to be summed with the input signal. Thus, when the rate of rotation is proportional to the input, there will be no further increase in power supplied to the DC motor 112.

In view of the comments made previously, it is believed that further comments with regard to FIG. 8 are unnecessary since it merely changes the circuit of FIG. 4 to use the rotor winding as the reference signal input and uses the stator winding as the pickoff winding from which the sample and hold signal will be taken and applied to the input amplifier.

While preferred embodiments of the present invention have been illustrated and detailed circuits are provided in FIGS. 4 and 8, the applicant does not wish to be limited to only the embodiments shown, but rather to the concept of utilizing an indication limited rotation torquer with a stator winding and a rotor winding. The inventive concept also includes the application of a reference pulse to one of the windings whether it be on the stator or the rotor and obtaining a reference indication of rotor position from the other winding utilizing this rotor position indication to apply torque control signals whereby the rotor is moved to a new position more closely indicative of the input signal.

In view of the above, I wish to be limited not by the embodiments illustrated but rather by the scope of the appended claims, wherein:

1. Apparatus for positioning an indicator pointer in closed loop servo fashion in accordance with a control signal comprising, in combination:
   prime movement means comprising a permanent magnet motor having a stator, a rotor, a control winding coupled with one of said stator and rotor, and a feedback winding coupled with the other of said stator and rotor;
   indicator pointer means attached to said rotor for use in displaying apparatus input signals;
   first means connected for, effectually, periodically initially applying a reference signal to said control winding and then applying a control error signal thereto for displacing the rotor in accordance with the error signal;
   second means including sample and hold means for sampling a feedback signal from said feedback winding during the application of a reference signal to said control winding and providing as an output a position signal for a predetermined time;
   apparatus input signal supplying means for supplying an input signal the value of which is to be displayed by said apparatus; and
   means connected to said first means, said second means and said apparatus input signal supplying means for supplying an error signal to said first means indicative of a comparison between the position signal and the input signal.

2. Apparatus as claimed in claim 1 wherein:
   said first means includes means for periodically disconnecting the application of all signals to said control winding for predetermined time periods immediately prior to application of the reference signal thereto.

3. Apparatus as claimed in claim 2 wherein:
   said second means includes circuitry for providing lead compensation in the position signal to initially over-emphasize the error signal generated.

4. Electromagnetic transducer apparatus comprising, in combination:

permanent magnet motor means including stator means and rotor means;

a stator winding coupled to said stator means and a further winding coupled to said rotor means, one of said windings being used for a reference signal input and the other for a pickoff signal output;

means for applying a reference pulse to the appropriate winding;

means for sampling the effects of the applied reference pulse as obtained from the pickoff signal winding to obtain an indication of position of said rotor means with respect to said stator means;

means for applying an apparatus input signal, an indication of which is to be obtained;

means for comparing the sampled pulse with the apparatus input signal to produce an error signal; and means for applying a signal indicative of the error signal to the appropriate winding for moving said rotor means toward a value indicative of the apparatus input signal.

* * * * *